(12) United States Patent
Biegelsen et al.

(10) Patent No.: US 10,115,654 B2
(45) Date of Patent: Oct. 30, 2018

(54) BURIED THERMALLY CONDUCTIVE LAYERS FOR HEAT EXTRACTION AND SHIELDING

(75) Inventors: David K. Biegelsen, Portola Valley, CA (US); Raj B. Apte, Palo Alto, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 185 days.

(21) Appl. No.: 12/819,022

(22) Filed: Jun. 18, 2010

(65) Prior Publication Data
US 2011/0309513 A1 Dec. 22, 2011

(51) Int. Cl.
*H01L 23/52* (2006.01)
*H01L 23/367* (2006.01)
(Continued)

(52) U.S. Cl.
CPC ........ *H01L 23/3677* (2013.01); *H01L 23/481* (2013.01); *H01L 23/49822* (2013.01);
(Continued)

(58) Field of Classification Search
CPC ......... H01L 2924/15153; H01L 23/481; H01L 23/5389; H01L 25/0652; H01L 25/0657;
(Continued)

(56) References Cited

U.S. PATENT DOCUMENTS

| 4,330,363 A | 5/1982 | Biegelsen et al. |
| 5,674,758 A * | 10/1997 | McCarthy ............. H01L 21/265 148/DIG. 12 |

(Continued)

OTHER PUBLICATIONS

Biegelsen, D.K., et al., "Origin of Oriented Crystal Growth of Radiantly Melted Silicon on SiO2", Appl. Phys. Lett. 45(5), Sep. 1984, p. 546-548.
(Continued)

*Primary Examiner* — Edward Chin
(74) *Attorney, Agent, or Firm* — Womble Bond Dickinson (US) LLP; Daniel Ovanezian

(57) ABSTRACT

An embodiment is a method and apparatus for heat extraction and shielding in multi-block semiconductor devices. A plurality of blocks stacked on each other is interconnected by vertical vias filled with thermally conducting material and separated by buried thermally conductive layers. A thermally conductive layer is bonded to bottom or top of the plurality of blocks as a ground plane or a heat extraction layer. The thermally conductive layer has a high thermal conductivity.

An embodiment is a method and apparatus for heat extraction and shielding in single-block semiconductor devices. A thermally insulative layer is deposited on a substrate. The thermally insulative layer is capable of supporting a thermal gradient to reduce heating of the substrate. A buried thermally conductive layer is formed inside the thermally insulative layer and has a vertical via to connect through the substrate to an external heat extracting layer. A semiconductor layer is deposited on the thermally insulative layer and patterned for electrical interconnects.

10 Claims, 5 Drawing Sheets

(51) Int. Cl.
 *H01L 23/48* (2006.01)
 *H01L 23/498* (2006.01)
(52) U.S. Cl.
 CPC .............. *H01L 2924/0002* (2013.01); *H01L 2924/12044* (2013.01)
(58) Field of Classification Search
 CPC ..... H01L 2924/19105; H01L 21/76885; H01L 21/84; H01L 2924/18162; H01L 29/78603
 USPC ........... 257/706, 720, E23.11, 712, E23.101, 257/E23.178, 781; 438/26
 See application file for complete search history.

(56) References Cited

U.S. PATENT DOCUMENTS

| | | | | |
|---|---|---|---|---|
| 6,127,619 | A * | 10/2000 | Xi | H01L 35/16 136/201 |
| 7,649,249 | B2 * | 1/2010 | Noguchi | H01L 23/3677 257/686 |
| 7,777,291 | B2 * | 8/2010 | Kabir | B01J 23/755 257/16 |
| 7,964,916 | B2 * | 6/2011 | Or-Bach | H01L 21/76254 257/347 |
| 8,076,586 | B2 * | 12/2011 | Tuominen | H01L 23/5389 174/252 |
| 8,093,729 | B2 * | 1/2012 | Trezza | H01L 21/6835 257/750 |
| 2004/0203552 | A1 * | 10/2004 | Horiuchi | H04B 1/005 455/333 |
| 2006/0131736 | A1 * | 6/2006 | Jansman | H01L 23/36 257/712 |
| 2007/0227761 | A1 * | 10/2007 | Tuominen et al. | 174/252 |
| 2009/0085193 | A1 * | 4/2009 | Cho | B82Y 10/00 257/702 |
| 2010/0133546 | A1 * | 6/2010 | Jain | H01L 21/187 257/72 |
| 2011/0018125 | A1 * | 1/2011 | Loo | H01L 23/16 257/706 |

OTHER PUBLICATIONS

Witte, D.J., et al., "Lamellar Crystallization of Silicon for 3-Dimensional Integration", Microelectronic Engineering, 84, p. 1186-1189, 2007.

Witte, D.J., "Rapid Laser Crystallization of Semiconductors for Three-Dimensional Integration", Dissertation submitted to the Dept. of EE and the committee on Graduate Studies of Stanford University, Jun. 2009.

* cited by examiner

US 10,115,654 B2

BURIED THERMALLY CONDUCTIVE LAYERS FOR HEAT EXTRACTION AND SHIELDING

TECHNICAL FIELD

The presently disclosed embodiments are directed to the field of semiconductor technology, and more specifically, to thermal layers in semiconductor devices.

BACKGROUND

Research has shown that excellent single crystalline silicon thin films can be grown on amorphous silica substrates by light induced zone melting and recrystallization. Adding another layer of thermally insulating silica, silicon oxynitride, or the like, depositing another layer of amorphous or poly silicon (or germanium or silicon germanium alloy, etc.) one can then recrystallize the top layer to achieve a second active layer of electronic material. Iteration of these steps can lead to multiple layers of active electronics.

However, there are problems regarding successful fabrication and use of such arrays. First, heating of the top semiconductor layer may disturb the already created devices in lower layers. Second, during use, performance may be degraded due to heat.

SUMMARY

One disclosed feature of the embodiments is a technique for heat extraction and shielding in multi-block semiconductor devices. A plurality of blocks stacked on each other is interconnected by vertical vias filled with thermally conducting material and separated by buried thermally conductive layers. A thermally conductive layer is bonded to bottom or top of the plurality of blocks as a ground plane or a heat extraction layer. The thermally conductive layer has a high thermal conductivity.

An embodiment is a method and apparatus for heat extraction and shielding in single-block semiconductor devices. A thermally insulative layer is deposited on a substrate. The thermally insulative layer is capable of supporting a thermal gradient to reduce heating of the substrate. A buried thermally conductive layer is formed inside the thermally insulative layer and has a vertical via to connect through the substrate to an external heat extracting layer. A semiconductor layer is deposited on the thermally insulative layer and patterned for electrical interconnects.

BRIEF DESCRIPTION OF THE DRAWINGS

Embodiments may best be understood by referring to the following description and accompanying drawings that are used to illustrate various embodiments. In the drawings.

DETAILED DESCRIPTION

Figure 1:
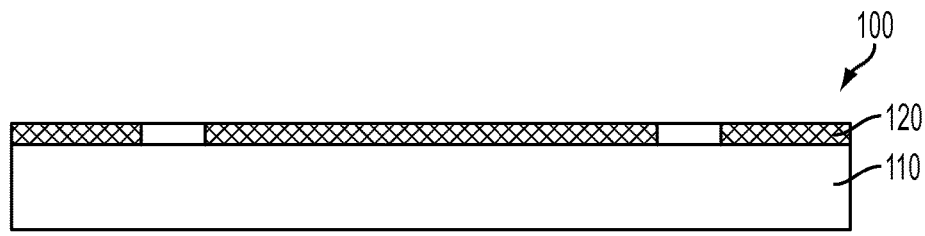
FIG. 1 is a diagram illustrating a first phase of fabrication of a multi-block device according to one embodiment.

One disclosed feature of the embodiments is a technique for heat extraction and shielding in multi-block semiconductor devices. A plurality of blocks stacked on each other is interconnected by vertical vias filled with thermally conducting material such as metal, hereinafter referred as "metal", and separated by buried thermally conductive layers. A thermally conductive layer is bonded to bottom or top of the plurality of blocks as an electrical common voltage plane, hereinafter referred to as a ground plane, or a heat extraction layer. The thermally conductive layer has a high thermal conductivity.

An embodiment is a method and apparatus for heat extraction and shielding in single-block semiconductor devices. A thermally insulative layer is deposited on a substrate. The thermally insulative layer is capable of supporting a thermal gradient to reduce heating of the substrate. A buried thermally conductive layer is formed inside the thermally insulative layer and has a vertical via to connect through the substrate to an external heat extracting layer. A semiconductor layer is deposited on the thermally insulative layer and patterned for electrical interconnects.

One disclosed feature of the embodiments may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc. One embodiment may be described by a schematic drawing depicting a physical structure. It is understood that the schematic drawing illustrates the basic concept and may not be scaled or depict the structure in exact proportions.

One disclosed feature of the embodiments is a method and apparatus for thermal extraction and shielding in semiconductor devices. Three dimensional monolithic integrated circuits may be fabricated with buried thermally conductive (e.g., metal) layers which are used to isolate previously processed layers from subsequent high temperature processing. The buried thermally conductive layers are further modified to extract the heat generated during circuit operation. The thermally conductive layers are connected by metal vias to an external thermally conductive layer acting as a heat extraction or ground plane. It is noted that even if the metal planes are not connected to each other or to an external heat sink by vias, the planes may still act to distribute heat laterally away from hot spots and thereby be beneficial. The buried thermally conductive layers may also be used for electronic screening between active layers. The same construction can also be used to enhance the fabrication and use of high temperature fabrication of semiconductors on low temperature substrates and for operating high speed/high current circuitry on low temperature substrates.

Adding a buried thermally conductive layer such as copper or aluminum to the thermally insulating buffer layer acts as an effective heat diffuser (and reflector of any radiation transmitting through the semiconductor layer).

Heat which diffuses down to the thermally conductive layer from the localized heat zone may be able to rapidly diffuse laterally in the metal layer. Thus the temperature in the lower device layers may be held below an acceptable level of say 400° C.

The buried thermally conductive layers may act as efficient means for the extraction of heat generated during circuit operation. Furthermore, the thermally conductive layers can perform the further useful function of acting as ground planes to minimize unwanted electronic interactions between layers. The thermal conductivity of copper (400 W/m/K) and aluminum (250 W/m/K) are much higher than that of thermal insulators such as silicon dioxide (1 W/m/K) and can thus guide heat out of device arrays with high effectiveness.

The technique may be beneficially applied to single active layer applications. In particular the fabrication and use of high current/high speed electronics both on low temperature substrates and on high temperature substrates would benefit greatly from the use of the buried thermally conductive heat diffuser and extractor.

The technique may be used in three-dimensional (3-D) arrays of active electronic circuitry or single layers of active electronics. In the description that follows, the term "block" may be used to indicate an active layer which may in turn include several layers of materials in a semiconductor device. The fabrication process may be effected in several phases or steps. The separation of the process into phases or steps is merely for illustrative purposes. The phases or steps may be combined or overlapped.

FIG. 1 is a diagram illustrating a first phase 100 of fabrication of a multi-block device according to one embodiment. The first phase 100 includes layers 110 and 120.

The layer 110 may be a substrate. It may be formed, created, or fabricated from an amorphous thermally insulating substrate such as glass or plastic having a top portion being a high temperature melting, thermally insulating layer such as glassy silica. The layer 120 may be a semiconductor layer such as silicon (or germanium or any other group IV semiconductor element or alloy) deposited on the substrate layer 110. The layer 120 may be patterned for circuit or electrical interconnects using traditional fabrication techniques. It may also be optionally encapsulated by a thin deposited dielectric layer. The layer 120 may be crystallized by scanned or pulsed optical irradiation by a high power source such as carbon dioxide, YAG, or excimer laser.

Figure 2:
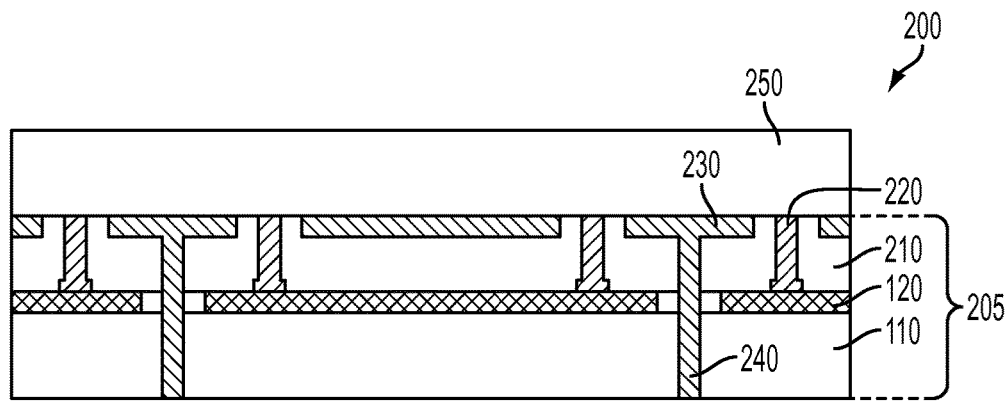
FIG. 2 is a diagram illustrating a second phase of fabrication of the multi-block device according to one embodiment.

FIG. 2 is a diagram illustrating a second phase 200 of fabrication of the multi-block device according to one embodiment. The second phase 200 includes the completion of the fabrication of a first block 205 and a portion 250 of the second block.

During the second phase, device doping and further necessary fabrication steps may be performed and in-plane electrical interconnects may be patterned. A silicon dioxide layer may be deposited. A thermally insulating layer 210 may be grown or deposited on the layer 120. Through-wafer and inter-plane vias 220 may be formed or constructed being filled with high thermal conductivity material such as copper. These vias 220 may provide interconnections to other blocks.

A buried thermally conductive layer 230 may be deposited on the layer 210. The buried thermally conductive layer 230 may be made of copper or aluminum or any material having a high thermal conductivity (e.g., higher than 200 W/m/K). It may act as an effective heat diffuser and/or reflector of any radiation transmitting through the semiconductor layer such as the layer 120 or 310 (shown in FIG. 3).

Figure 3:
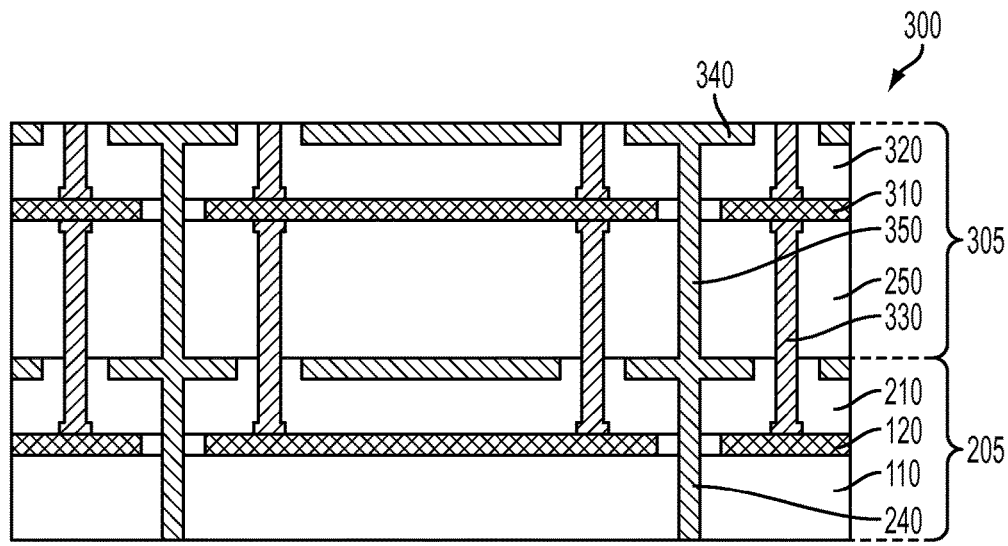
FIG. 3 is a diagram illustrating a third phase of fabrication of the multi-block device according to one embodiment.
Figure 4:
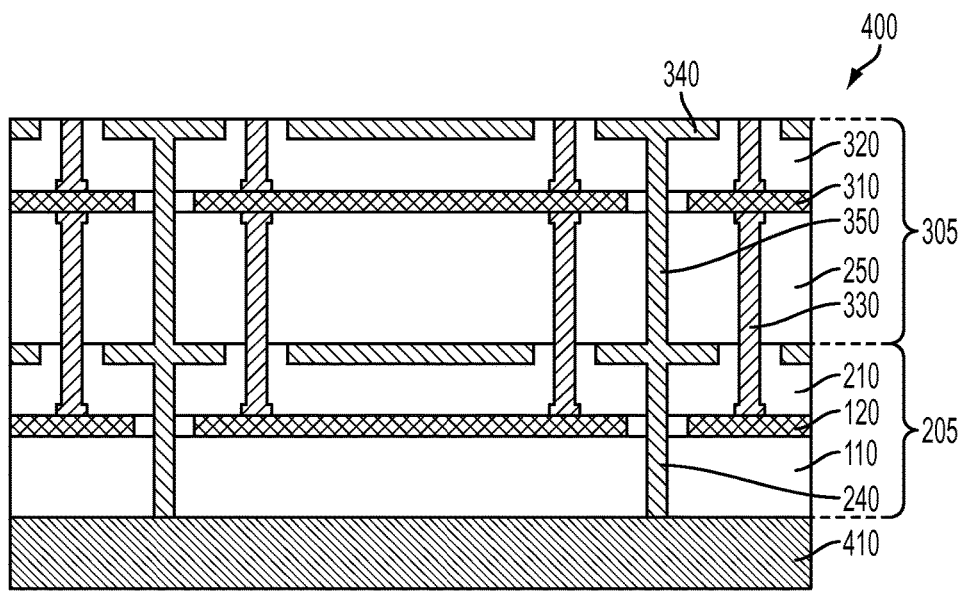
FIG. 4 is a diagram illustrating a final phase of fabrication of the multi-block device according to one embodiment.

One or more vertical vias 240 may be constructed to connect to the buried thermally conductive layer 230. The vertical via 240 may be extended to interconnect all the buried thermally conductive layers in the device as shown in FIGS. 3 and 4. A thermally insulating layer 250 may be grown or formed on the buried thermally conductive layer 230.

FIG. 3 is a diagram illustrating a third phase 300 of fabrication of the multi-block device according to one embodiment. The third phase 300 forms a second block 305 stacked on the first block 205. The fabrication of the layers in the second block 305 may be similar to that of the first block 205.

Through-wafer and inter-plane vias 330 may be formed or constructed being filled with high thermal conductivity material such as copper. The vias 330 may be combined with vias 220 shown in FIG. 2 to form vias that interconnect circuit components in blocks 205 and 305.

A semiconductor layer 310 may be deposited on the layer 250 in a similar manner as the layer 120 in FIG. 1. The semiconductor layer 310 may be patterned for circuits and may be fabricated using standard fabrication techniques. A thermally insulating layer 320 may be grown or deposited on the semiconductor layer 310. A buried thermally conductive layer 340 may be deposited on the layer 320. Similar to the buried thermally conductive layer 230, the buried thermally conductive layer 340 may be made of metal (e.g., copper or aluminum) or any material having a high thermal conductivity (e.g., higher than 200 W/m/K). It may act as an effective heat diffuser and/or reflector of any radiation transmitting through the semiconductor layer. A vertical via 350 may be constructed to connect the buried thermally conductive layer 340 to the buried thermally conductive layer 230 in the first block 205. Additional blocks may be fabricated to stack on the first and second blocks 205 and 305. The fabrication forms monolithic 3-D stacked active electronic circuits.

FIG. 4 is a diagram illustrating a final phase 400 of fabrication of the multi-block device according to one embodiment. The final phase 400 includes the first and second blocks 205 and 305 stacked on each other and a thermally conductive layer 410.

The thermally conductive layer 410 may be bonded to bottom or top of the plurality of blocks 205 and 305 as a ground plane or a heat extraction layer. The thermally conductive layer 410 has a high thermal conductivity higher than 200 W/m/K. Examples of material for the thermally conductive layer 410 may include copper with thermal conductivity of 400 W/m/K and aluminum with thermal conductivity of 250 W/m/K. The thermally conductive layer 410 may act as a heat sink which is integrated into the device. The vertical vias 240 and 350 therefore may be combined to serve as heat guides to direct heat to the thermally conductive layer 410.

Various modifications to the design may be made. For example, the thermally conductive layer 410 may be provided on the top side, closer to the heat generation, if access to the top side is not required. Such access may be required, for example, in a display or sensor array application. In the case of a 3-D processor, on the other hand, there would be no need to have optical access and the thermally conductive layer 410 may be provided on the top side.

Another modification may be that the vertical heat guides (e.g., the vertical vias 240 and 350) need not be connected in common. For example, if the various planes are used as power and ground planes, then separate vias may be used and brought to separate heat extracting layers. In the case of the power plane the heat extracting layer may be thermally connected to the vias, but, optionally, electrically disconnected.

The fabrication process or the design may be applied to a single block of active layers of electronics.

Figure 5:
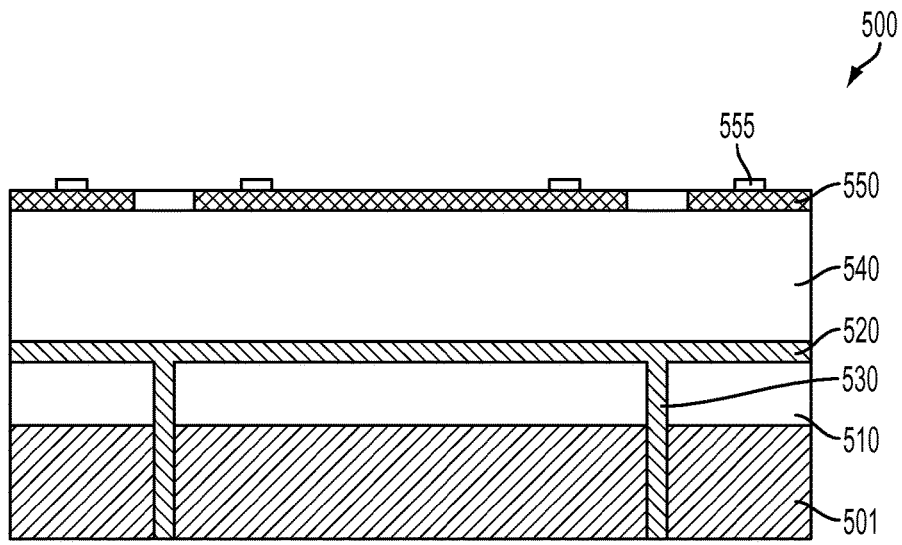
FIG. 5 is a diagram illustrating a single-block device according to one embodiment.

FIG. 5 is a diagram illustrating a single-block device 500 according to one embodiment. The device 500 includes layers 501, 510, 520, 540, and 550.

The layer 501 is a substrate layer that may be glass or plastic. The layers 510 and 540 may be a thermally insulative layer deposited on the substrate layer 501. The thermally insulative layer may be optional. The thermally insulative layer of 510 and 540 may be a thick film of silica or similar material. They may be used to reduce the temperature at the low temperature substrate layer during fabrication and/or use. The layer 520 may be a buried thermally conductive layer constructed inside the thermally insulative layer and separate the thermally insulative layer into the layer 510 and 540. The buried thermally conductive layer 520 may have a vertical via 530 to connect through the substrate to an external heat extracting or heat sinking layer.

The layer 550 may be an amorphous, polycrystalline, or recrystallized single crystalline semiconductor layer, such as silicon. It may be deposited on the thermally insulative layer 540 and optionally encapsulated with silica or similar material. It may be patterned for electrical interconnects or circuits 555.

A laser recrystallization process may be used to define single crystalline regions. High speed electronic circuits are fabricated. All further steps in completing the device, such as adding a photosensor layer or display (e.g. OLED) layer, may then be completed. The heat sinking vias (e.g., vias 530) may be connected to an external heat sink. The transistors may be used at high dissipation levels without damaging the low temperature substrate. Similarly, if a thermally conductive layer is interposed between the active layer and the display or sensing layer above, the heat generated may be isolated from the photo-interaction layer.

Figure 6:
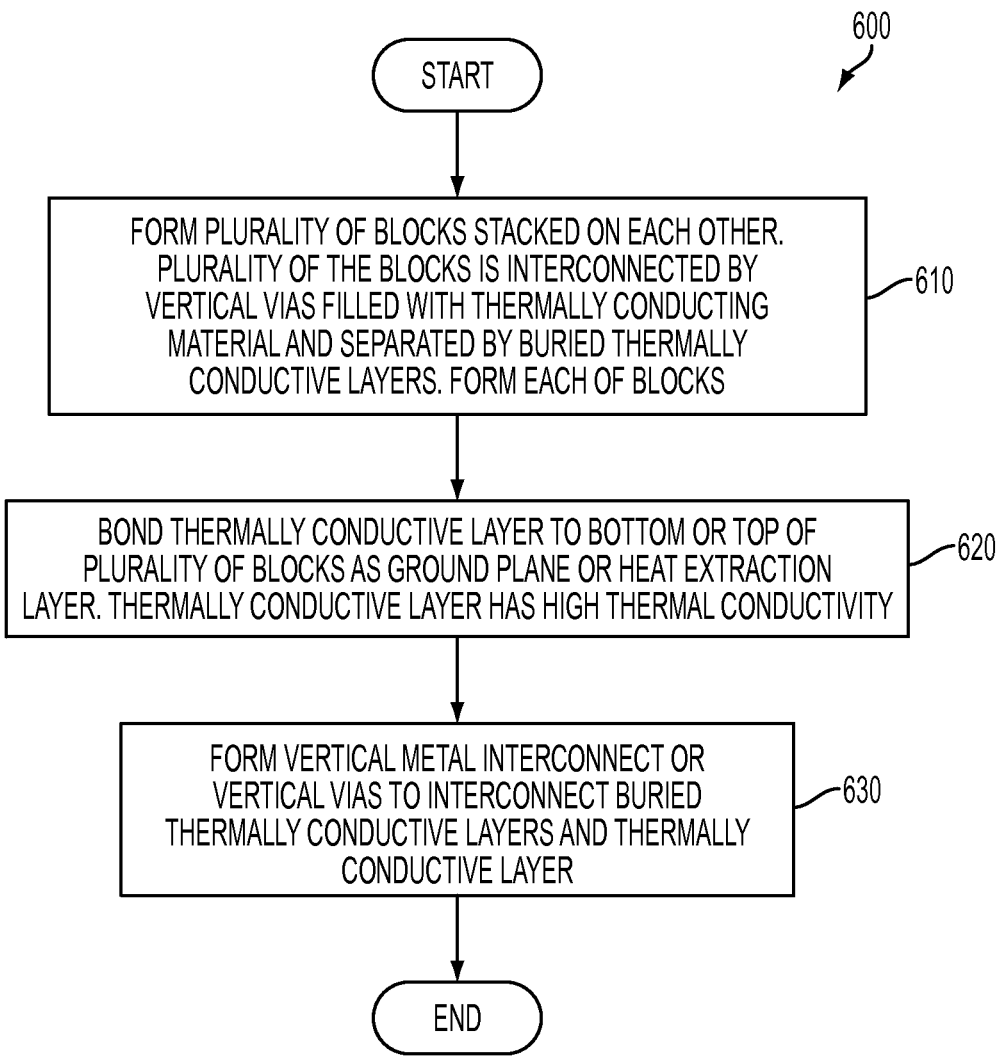
FIG. 6 is a flowchart illustrating a process to fabricate a multi-block device according to one embodiment.

FIG. 6 is a flowchart illustrating a process 600 to fabricate a multi-block device according to one embodiment.

Upon START, the process 600 forms a plurality of blocks stacked on each other. The plurality of blocks may be interconnected by vertical vias filled with thermally conducting material and separated by buried thermally conductive layers. Forming the plurality of blocks including forming each of the blocks (Block 610). Next, the process 600 bonds a thermally conductive layer to bottom or top of the plurality of blocks as ground plane or heat extraction layer (Block 620). The thermally conductive layer has a high thermal conductivity such as metal. In one embodiment, the thermally conductive layer has a thermal conductivity higher than 200 W/m/K.

Then, the process 600 forms vertical metal interconnects or vertical vias to interconnect the buried thermally conductive layers and the thermally conductive layer (Block 630). The process 600 is then terminated.

Figure 7:
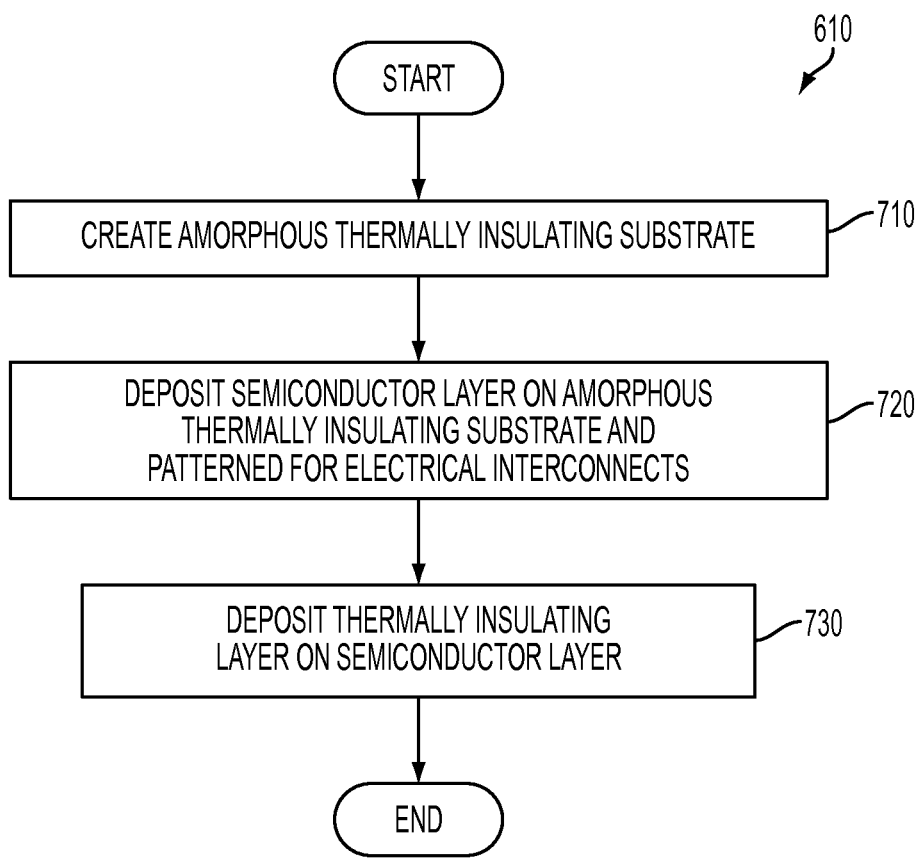
FIG. 7 is a flowchart illustrating a process to fabricate a block in the multi-block device according to one embodiment.

FIG. 7 is a flowchart illustrating the process 610 to fabricate a block in the multi-block device according to one embodiment.

Upon START, the process 610 creates an amorphous thermally insulating substrate (Block 710). Next, the process 610 deposits a semiconductor layer on the amorphous thermally insulating substrate and patterned for electrical interconnects (Block 720). Then, the process 610 deposits a thermally insulating layer on the semiconductor layer (Block 730). The process 610 is then terminated.

Figure 8:
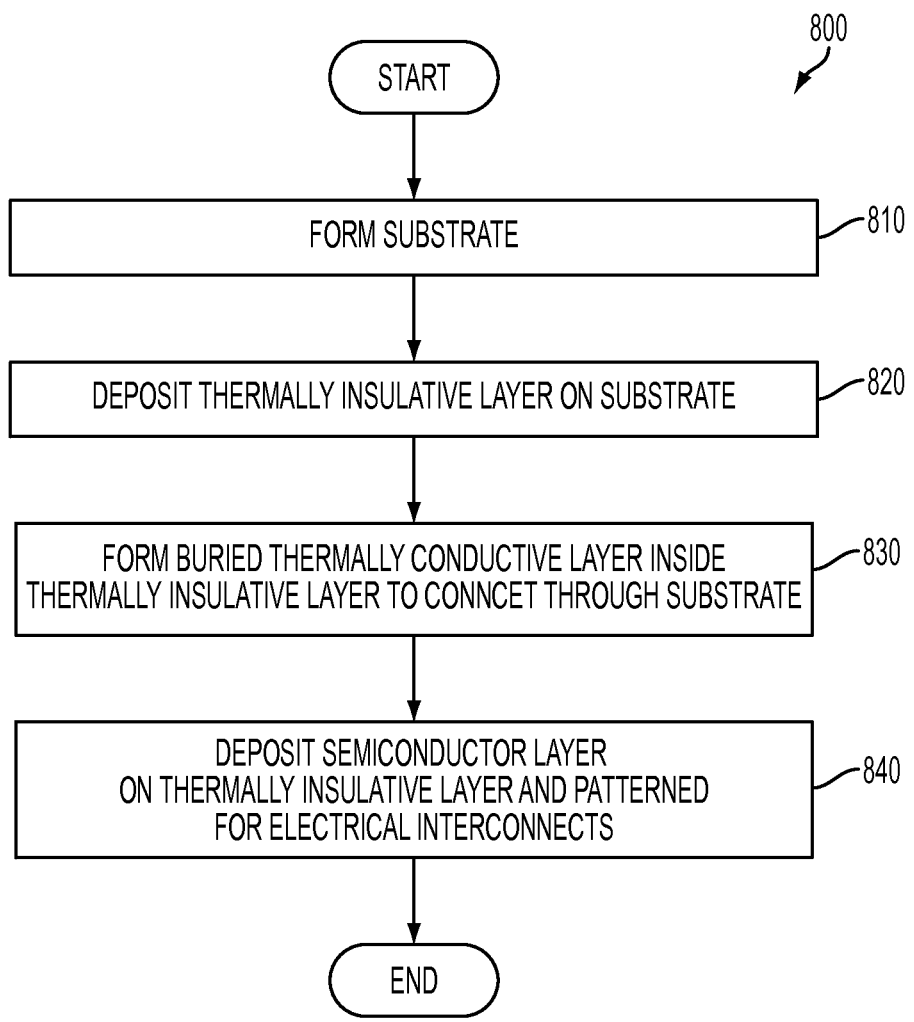
FIG. 8 is a flowchart illustrating a process to fabricate a single-block device according to one embodiment.

FIG. 8 is a flowchart illustrating a process 800 to fabricate a single-block device according to one embodiment.

Upon START, the process 800 forms a substrate (Block 810). In one embodiment, the substrate is glass or plastic. Next, the process 800 depositing a thermally insulative layer on the substrate (Block 820). The thermally insulative layer is capable of supporting a thermal gradient to reduce heating of the substrate. In one embodiment, the thermally insulative layer is a thick film of silica or similar material. Then, the process 800 forms a buried thermally conductive layer inside the thermally insulative layer (Block 830). The buried thermally conductive layer has a vertical via to connect through the substrate to an external heat extracting layer. The buried thermally conductive layer may have a thermal conductivity higher than 200 W/m/K Next, the process 800 deposits a semiconductor layer on the thermally insulative layer and patterned for electrical interconnects and/or circuits (Block 840). The process 800 is then terminated.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. A device comprising:
   a plurality of blocks grown sequentially on each other, the plurality of the blocks being interconnected by vertical vias filled with thermally conducting material, wherein each of the blocks comprises:
      an insulating layer,
      a semiconductor layer being deposited on the insulating layer below,
      a thermally insulating layer being deposited on the semiconductor layer below, and
      a buried thermally conductive layer being deposited on the thermally insulating layer below; and
   a thermally conductive layer bonded to bottom or top of the plurality of blocks as a ground plane or a heat extraction layer, the thermally conductive layer having a high thermal conductivity,
   wherein
      the vertical vias contact the thermally conductive layer and pass through the insulating layer, the thermally insulating layer, and the buried thermally conductive layer in the plurality of blocks,
      the vertical vias do not contact the semiconductor layers of the plurality of blocks, and
      inter-plane vias connect the semiconductor layers of the plurality of blocks.

2. The device of claim 1 wherein
   the insulating layer is an amorphous thermally insulating substrate, wherein the semiconductor layer is patterned for electrical interconnects, and
   wherein the amorphous thermally insulating substrate is different in composition from the thermally insulating layer.

3. The device of claim 1 further comprising:
   at least one vertical metal interconnect to interconnect the buried thermally conductive layer and the thermally conductive layer.

4. The device of claim 1, wherein
   the vertical vias interconnect the plurality of blocks and the thermally conductive layer.

5. The device of claim 1 wherein the thermally conductive layer has a thermal conductivity higher than 200 W/m/K.

6. A method comprising:
forming a plurality of blocks grown sequentially on each other, the plurality of the blocks being interconnected by vertical vias filled with thermally conducting metal, wherein forming a plurality of the blocks comprises forming each of the blocks, wherein forming each of the blocks comprises:
depositing the semiconductor layer on an insulating layer below, and
depositing a thermally insulating layer on the semiconductor layer below, and
depositing a buried thermally conductive layer on the thermally insulating layer below; and
forming a thermally conductive layer at the bottom or at the top of the plurality of blocks as a ground plane or a heat extraction layer, the thermally conductive layer having a high thermal conductivity,
wherein
the vertical vias contact the thermally conductive layer and pass through the insulating layer, the thermally insulating layer, and the buried thermally conductive layer in the plurality of blocks,
the vertical vias do not contact the semiconductor layers of the plurality of blocks, and
inter-plane vias connect the semiconductor layers of the plurality of blocks.

7. The method of claim 6 wherein forming each of the blocks comprises:
creating an amorphous thermally insulating substrate, the amorphous thermally insulating substrate being the insulating layer,
wherein the semiconductor layer is patterned for electrical interconnects, and
wherein the amorphous thermally insulating substrate is different in composition from the thermally insulating layer.

8. The method of claim 6 further comprising:
forming a vertical metal interconnect to interconnect the buried thermally conductive layers and the thermally conductive layer.

9. The method of claim 6 further comprising:
forming the vertical vias to interconnect the buried thermally conductive layers and the thermally conductive layer.

10. The method of claim 6 wherein the thermally conductive layer has a thermal conductivity higher than 200 W/m/K.

* * * * *